(12) United States Patent
Oka et al.

(10) Patent No.: US 9,385,288 B2
(45) Date of Patent: Jul. 5, 2016

(54) LIGHT-EMITTING DEVICE

(71) Applicant: NICHIA CORPORATION, Anan-shi (JP)

(72) Inventors: Yuta Oka, Tokushima (JP); Satoshi Okada, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/315,437

(22) Filed: Jun. 26, 2014

(65) Prior Publication Data

US 2015/0021640 A1 Jan. 22, 2015

(30) Foreign Application Priority Data

Jun. 26, 2013 (JP) ................................ 2013-133261

(51) Int. Cl.
*H01L 33/00* (2010.01)
*H01L 33/60* (2010.01)
*H01L 33/62* (2010.01)
*H01L 23/00* (2006.01)

(52) U.S. Cl.
CPC ................ *H01L 33/60* (2013.01); *H01L 24/48* (2013.01); *H01L 33/62* (2013.01); *H01L 24/45* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48247* (2013.01); *H01L 2224/48257* (2013.01); *H01L 2224/8592* (2013.01); *H01L 2924/00014* (2013.01); *H01L 2924/12035* (2013.01); *H01L 2924/12041* (2013.01); *H01L 2924/181* (2013.01)

(58) Field of Classification Search
CPC .................. H01L 21/563; H01L 2021/60022; H01L 2924/18161
USPC ............................................... 257/98, 88, 100
See application file for complete search history.

(56) References Cited

U.S. PATENT DOCUMENTS

| | | | |
|---|---|---|---|
| 7,531,845 B2 | 5/2009 | Oshio et al. | |
| 7,728,343 B2 | 6/2010 | Fujino et al. | |
| 7,938,561 B2 * | 5/2011 | Suehiro et al. | ............ 362/249.02 |
| 8,890,203 B2 * | 11/2014 | Kobayakawa | .......... H01L 33/62 257/98 |
| 2009/0246912 A1 * | 10/2009 | Ueda | ..................... H01L 21/561 438/113 |
| 2012/0057099 A1 * | 3/2012 | Tanuma | ............... G02B 6/0073 349/62 |
| 2013/0001633 A1 * | 1/2013 | Imai et al. | ........................ 257/99 |
| 2015/0108510 A1 * | 4/2015 | Urano et al. | .................... 257/88 |

FOREIGN PATENT DOCUMENTS

| | | |
|---|---|---|
| JP | 2004-055632 | 2/2004 |
| JP | 2007-201171 | 8/2007 |
| JP | 2007-243226 | 9/2007 |

(Continued)

*Primary Examiner* — Tan N Tran
(74) *Attorney, Agent, or Firm* — Mori & Ward, LLP

(57) ABSTRACT

A light-emitting device includes a lead frame, a white resist, a light-emitting element, and a wire. The white resist is provided on the lead frame to be in contact with the lead frame. The white resist has an opening to expose the lead frame. The light-emitting element is disposed on the white resist and includes a transparent substrate and a semiconductor layer. The transparent substrate is bonded to the white resist via a bonding member. The semiconductor layer is provided on the transparent substrate. The wire connects the light-emitting element and the lead frame at the opening.

22 Claims, 5 Drawing Sheets

(56) References Cited

FOREIGN PATENT DOCUMENTS

| JP | 2007-324205 | 12/2007 |
| JP | 2008-060344 | 3/2008 |
| JP | 2012-109404 | 6/2012 |
| JP | 2013-089717 | 5/2013 |

* cited by examiner

US 9,385,288 B2

LIGHT-EMITTING DEVICE

CROSS-REFERENCE TO RELATED APPLICATIONS

The present application claims priority under 35 U.S.C. §119 to Japanese Patent Application No. 2013-133261, filed Jun. 26, 2013. The contents of this application are incorporated herein by reference in their entirety.

TECHNICAL FIELD

The present invention relates to a light-emitting device.

BACKGROUND ART

A light-emitting device using a light-emitting element such as a light-emitting diode is used in many fields which include general lighting of an interior lamp, vehicle lighting, a backlight of a liquid crystal display and the like. Then, performance required in these light-emitting devices is increased day by day, and high output (high brightness) is further required.

In order to efficiently reflect light from a light-emitting element corresponding to a high output as described above, as exemplified in Japanese Unexamined Patent Application Publication No. 2007-201171 and Japanese Unexamined Patent Application Publication No. 2007-243226, a configuration to improve light emitting efficiency by forming a white resist layer near the light-emitting element to reflect light is known.

Specifically, an electrode formed on a substrate is coated with a white resist, and an opening is provided on the white resist layer in a portion where a light-emitting element is placed, thereby electrically connecting the electrode and the light-emitting element.

SUMMARY OF THE INVENTION

According to one aspect of the present invention, a light-emitting device includes a lead frame, a white resist, a light-emitting element, and a wire. The white resist is provided on the lead frame to be in contact with the lead frame. The white resist has an opening to expose the lead frame. The light-emitting element is disposed on the white resist and includes a transparent substrate and a semiconductor layer. The transparent substrate is bonded to the white resist via a bonding member. The semiconductor layer is provided on the transparent substrate. The wire connects the light-emitting element and the lead frame at the opening.

MODES FOR CARRYING OUT THE INVENTION

Hereinafter, examples of the present invention will be described with reference to the attached drawings.

First Embodiment

Figure 1:
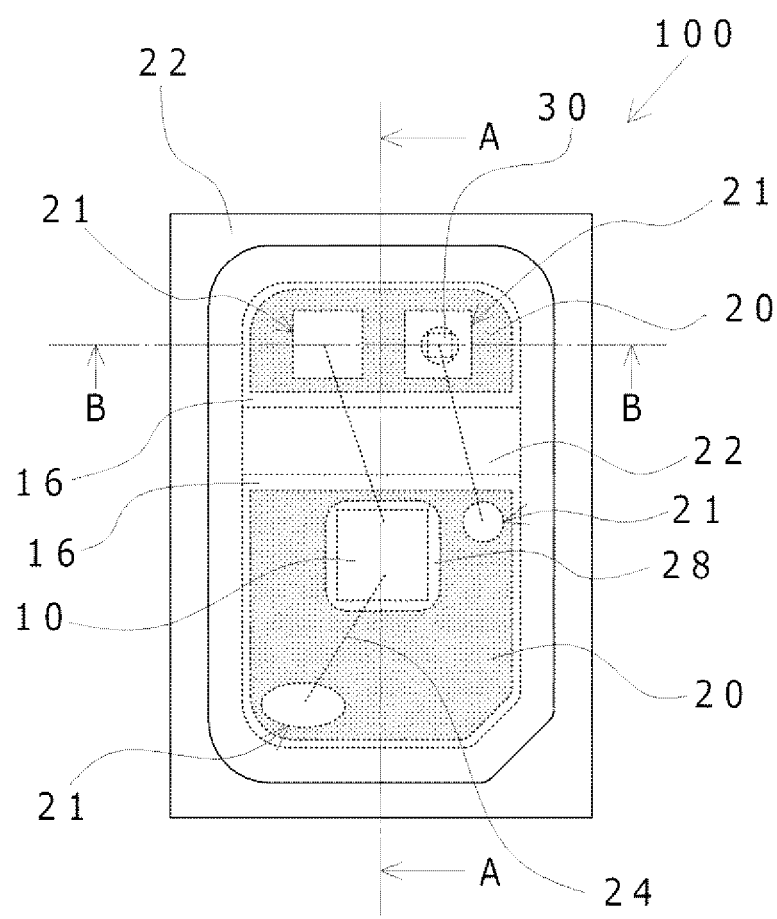
FIG. 1 is a schematic plan view of a light-emitting device according to a first embodiment of the invention.
Figure 2A:
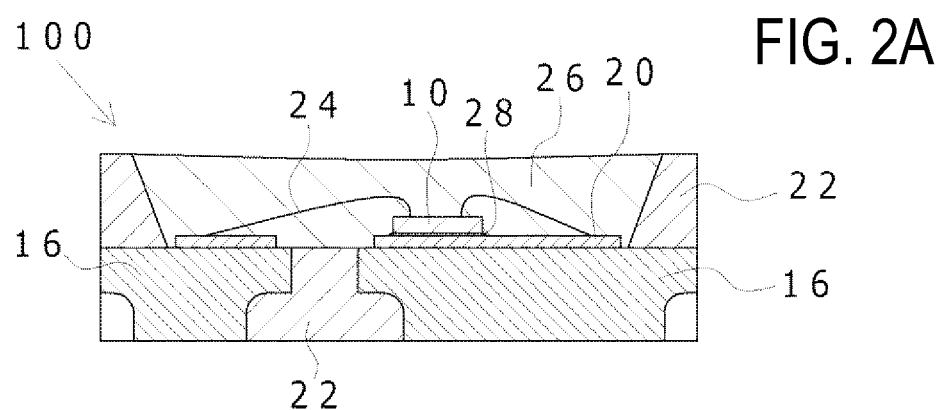
FIG. 2A is a schematic cross-sectional view of the light-emitting device according to the first embodiment of the invention.
Figure 2B:
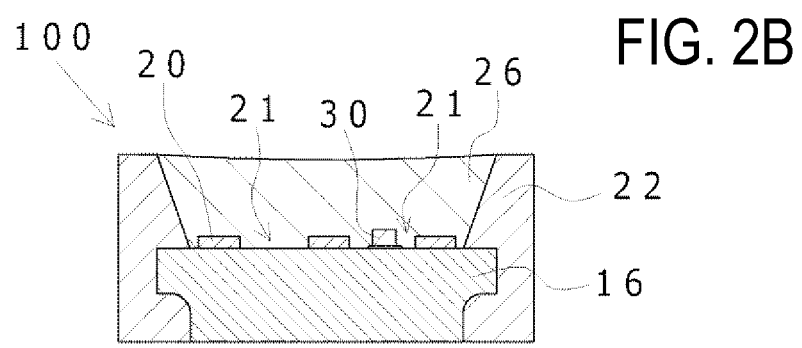
FIG. 2B is a schematic cross-sectional view of the light-emitting device according to the first embodiment of the invention.

FIG. 1 is a schematic plan view of a light-emitting device 100 according to an embodiment of the invention. FIG. 2A is a schematic cross-sectional view taken along line A-A of the light-emitting device shown in FIG. 1, FIG. 2B is a schematic cross-sectional view taken along line B-B of the light-emitting device shown in FIG. 1. As shown in FIGS. 1, 2A and 2B, a light-emitting device 100 according to an embodiment of the invention includes a lead frame 16, a white resist 20 disposed in contact with the lead frame 16, and a light-emitting element 10 disposed on the white resist 20 through a bonding member 28. In FIG. 1, the white resist 20 is shown in gray.

At least a pair of positive and negative lead frames 16 are disposed to be spaced apart from each other, and are fixed by a resin member 22. The resin member 22 fixes the lead frame 16 at a lower side of the light-emitting device 100, and a recess for accommodating the light-emitting element 10 is formed at an upper side of the light-emitting device 100. It is preferable to form a reflector which can reflect and extract light from the light-emitting element 10 at side walls of the recess.

The white resist 20 is disposed at a portion where at least the light-emitting element 10 is placed (hereinafter, referred to as a die attaching portion), and has a role of reflecting light which is emitted downwards as viewed from a light-emitting layer of the light-emitting element 10 toward a light extraction surface side, that is, upwards of the light-emitting element 10.

The light-emitting element 10 has a semiconductor layer on a transparent substrate, and furthermore has an electrode on the upper surface thereof, and the electrode and the lead frame 16 are connected by a wire 24, and thereby have an electrical conductivity. Therefore, in the white resist 20, an opening 21 is formed in a region where at least the wire 24 and the lead frame 16 are electrically connected.

An opening shape and a size of the white resist 20 may be any shape and any size which can perform wire bonding on the wire 24; however, a smaller size is preferred in view of a purpose of reflecting light. As an opening shape, for example, circles, ellipses, rectangles, and the like are appropriately used, and particularly circles or rectangles are preferred. In addition, as a size of the opening, for example, a diameter or a diagonal length of a rectangle is about 150 μm to 300 μm, and more preferably 200 μm or less.

In the embodiment, after a recess made of the resin member 22 is molded, the white resist 20 is formed at the lead frame 16 portion which corresponds to a bottom of the recess. The white resist 20 is disposed in contact with the lead frame 16, such that heat transferred to the white resist 20 through the lead frame 16 can be released to the lead frame 16. In the related art, a white resist which is generally used includes an epoxy resin and includes a plurality of carbon-carbon double bonds in a resin material, such that reflectance of the white resist is lowered due to deterioration by light or heat. Therefore, an opening is provided at the white resist in a die attaching portion, and the light-emitting element and the white resist are formed so as not to be directly connected to each other.

In the embodiment, a material of the white resist 20 is obtained by kneading reflective particles such as $TiO_2$ and the like, and a binder of an organic substance or an inorganic substance. The so-called white resist, white ink, ceramic ink and the like are applicable. As a binder of an organic substance, a silicon resin, a fluorine resin, or the like which is excellent in heat resistance and light resistance is preferably used, and it is particularly preferable to use the fluorine resin. By forming the white resist 20 on a lead frame which has high thermal conductivity using such a material, it is possible to provide a light-emitting element with high light extraction efficiency by suppressing deterioration of the white resist even if an opening is not provided right below the light-emitting element 10 as in the related art.

Reflective particles included in the white resist 20 hardly absorb light from the light-emitting element 10, and disperse powder of a reflection member (inorganic material such as $TiO_2$, $Al_2O_3$, $ZrO_2$, MgO, and the like) which has a large refractive index difference with respect to a resin serving as a ground material, and thereby it is possible to efficiently reflect light.

A thickness of the white resist 20 is preferably 5 µm to 50 µm, and more preferably 25 µm or less because too thick of a thickness makes it hard to release heat to the lead frame. The white resist 20 may be formed by laminating two or more layers.

The white resist 20 transmits light from the light-emitting element 10 depending on the thickness (for example, a part of light transmits in the case where the thickness is around 20 µm). Therefore, it is preferable to form the lead frame 16 of a material having a high reflectance with respect to light from the light-emitting element so that light from the light-emitting element is not transmitted to or absorbed in the resin member 22 side as it is. Accordingly, it is possible to improve light extraction efficiency by reflecting light using not only the white resist 20 but also the lead frame 16.

Therefore, it is preferable that metal plating such as silver, aluminum, copper, gold, and the like is applied to an outermost surface of the lead frame 16. In particular, it is preferable to include silver at the outermost surface. While having a high reflectance with respect to light from the light-emitting element, silver has a problem of discoloration caused by sulfidation or a decrease in the light extraction efficiency according to the discoloration; however, gas barrier properties are improved by coating a surface using the white resist 20 as shown in the embodiment, and thus it is possible to suppress sulfidation.

It is preferable that thermal conductivity of the lead frame 16 be 300 W/m·K or more. It is more preferable that thermal conductivity of the lead frame be 350 W/m·K or more. As a material having such a thermal conductivity, iron, phosphorus blue copper, a copper alloy, a cladding material, and the like can be exemplified. Accordingly, it is possible to effectively release heat which is from the light-emitting element 10 from the lead frame 16.

Furthermore, a thickness of the lead frame 16 is preferably 0.1 mm to 1.0 mm. In particular, it is appropriate that the thickness is about 0.25 nm to 0.5 mm. Since heat release is improved as the thickness becomes thicker, a thickness of the white resist can be made thick.

In the embodiment, a lower surface of the light-emitting element 10 is assumed as a transparent substrate, and the transparent substrate as a bonded surface is connected to the white resist 20 through the bonding member 28. In other words, the transparent substrate of the light-emitting element 10 and the white resist 20 are connected to each other through the bonding member 28. Light emitted from the light-emitting element 10 transmits through the bonding member 28 on the bonded surface and is reflected by the white resist 20, and light is extracted to an upper surface side of the light-emitting element. By having a transparent substrate of the light-emitting element, it is possible to transfer light emitted from a semiconductor layer downwards and to irradiate the white resist 20 right below the light-emitting element 10 with light, and thereby it is possible to efficiently reflect the light. As a transparent substrate, there is a substrate such as sapphire and the like.

The bonding member 22 is preferably transparent so as to allow light from the light-emitting element 10 to be transmitted. However, even if a reflecting member or a shielding member is included, when transmitting light is present, it is possible to allow the transmitting light to be reflected on an upper surface side of the light-emitting element.

The white resist 20 is required to be formed on at least a portion of the lower surface of the light-emitting element 10. The white resist 20 is preferably formed so as to correspond to the entire bonded surface of the light-emitting element 10, and furthermore, is more preferably formed to extend to a periphery of the bonded surface of the light-emitting element 10. In the case where the lower surface of the light-emitting element 10 is entirely connected to the white resist 20, it is possible to efficiently reflect light from the light-emitting element 10. In addition, since light of the light-emitting element 10 is emitted from not only the lower surface of the light-emitting element but also from an entire periphery of the light-emitting element such as a side surface, an upper surface, or the like, it is possible to efficiently reflect the light by forming the white resist 20 at the periphery of a bonded surface.

Figure 5:
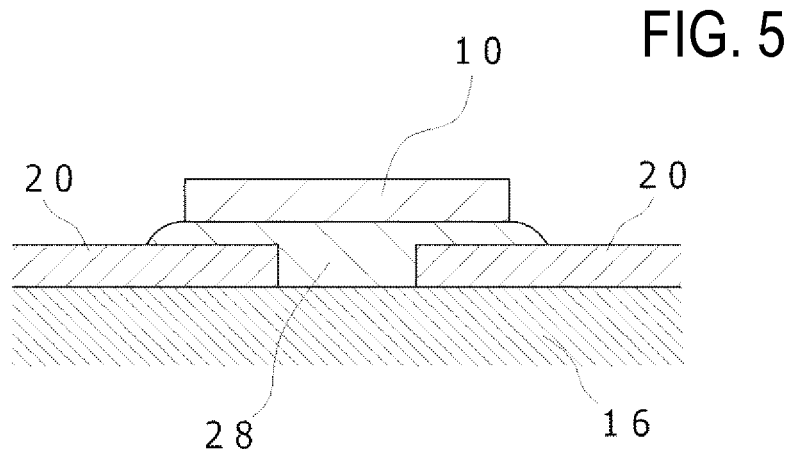
FIG. 5 is a partial description view which describes an example of an embodiment of the invention.

The white resist 20 has a worse thermal conductivity than the lead frame 16, such that, as shown in FIG. 5, the lead frame 16 may be exposed from the white resist 20 by opening a portion of the white resist 20 on the bonded surface between the white resist 20 and the light-emitting element 10. (In FIG. 5, the lead frame 16 is exposed by opening the white resist at a portion near a center of the bonded surface between the white resist 20 and the light-emitting element 10). It is preferable that a portion where the white resist 20 is opened be filled with the bonding member 28.

In the embodiment, since the light-emitting element 10 is placed on the white resist 20, it is preferable that the white resist 20 have hardness suitable for performing wire bonding on an electrode of the light-emitting element 10. Specifically, coating film hardness is preferably 5H or more. This is because ultrasonic waves while performing wire bonding are hard to transfer when the coating film is too soft, and thereby bonding failure occurs.

As a method of forming a white resist, even if not particularly limited, for example, screen printing is exemplified. Additionally, it is possible to form the white resist by a spray coating and the like with a masking.

Hereinafter, each member will be described in detail.

Lead Frame

A lead frame of a flat plate shape can be used as the lead frame 16, and a metal plate in which a step or unevenness is provided can also be used as the lead frame 16. The lead frame 16 is made by performing a punching process, an etching process, or the like on a metal plate of a flat plate shape. The etched lead frame 16 has a recess and a protrusion formed in a cross-sectional shape as shown in FIGS. 2A and 2B, and thereby it is possible to improve adhesion to the resin member. In the etching process, since it is possible to form a shape having the recess and the protrusion at an entire cross-sectional portion (etched portion) of the lead frame, it is possible to increase a bonded surface area between the lead frame 16 and the resin member and to improve adhesion of these members.

Moreover, in a method of punching a metal plate of a flat plate shape, a wear of a mold according to punching increases cost for replacing parts, and thus cost for manufacturing of the lead frame may be increased. In contrast, in the etching process, a punching mold is not used, and when the number of packages obtained per frame is large, it is possible to manufacture a lead frame at a low cost per package.

Resin Member

The resin member 22 is a member which is embedded between a pair of lead frames, and separates positive and negative lead frames by insulating between them. In the embodiment, the lead frame 16 is insert-molded in the resin member 22, and thereby a support body (package) which has a recess to place the light-emitting element 10 is formed. Side walls in the recess are in a tapered shape that becomes wider towards the outside, and functions as a reflector to reflect light of the light-emitting element 10. As described above, it is preferable that the recess have a shape to be wider towards an opening; however, the recess may have other shapes including a cylindrical shape.

The recess can have various shapes such as a substantially circular shape, a substantially elliptical shape, a substantially rectangular shape, a substantially polygonal shape, a combination of these, and the like as viewed from an outer upper surface side.

As a material of the resin member 22, it is preferable to use a transmitting resin highly filled with light reflective material. A thermoplastic resin or a thermosetting resin can be used. By using the thermosetting resin, it is possible to suppress deterioration caused by heat or light. It is preferable to form the thermosetting resin of at least one type selected from a group consisting of an epoxy resin, a modified epoxy resin, a silicon resin, a modified silicon resin, an acrylate resin, a urethane resin, and a phenol resin.

As a method of molding the resin member 22, injection molding or transfer molding which uses a mold, and furthermore various methods such as a method of attaching a cast reflector and the like can be adopted. In the embodiment, the resin member 22 is molded using the transfer molding.

Light-Emitting Element

For example, a light-emitting diode can be used as the light-emitting element 10. As the light-emitting element 10, a light-emitting element in which a semiconductor layer (for example, nitride semiconductor layer) is laminated on a transparent substrate such as sapphire (insulating member) can preferably be used. The light-emitting element 10 can be mounted through the bonding member 28 so as to dispose an insulating member on a white resist side. In the embodiment, since the light-emitting element 10 is placed on the insulating white resist 20, it is preferable that an electrode of the light-emitting element 10 have a pair or more of positive and negative electrodes on a surface opposite to a surface which is a surface bonded to the white resist. By performing wire bonding on the electrode, the lead frame 16 and the light-emitting element 10 are electrically connected to each other. When using a plurality of light-emitting elements, electrodes of the light-emitting element may be connected to each other using a wire 24. The wire 24 may be various types of material such as a metal and the like having electrical conductivity. The wire 24 is preferably made of gold, copper, aluminum, silver, or a gold alloy, a silver alloy, and the like.

Bonding Member

The bonding member 28 is a member which bonds the light-emitting element 10 to the white resist 20. In the embodiment, the bonding member does not need to be conductive, and epoxy resin, silicon resin, polyimide resin, acrylic resin or a resin such as unsaturated polyester and the like are appropriately exemplified. These can be used alone or in a mixture of two types or more. In addition, the bonding member may include a conductive material such as gold, silver, copper, carbon, or the like.

Sealing Member

The light-emitting element 10 can appropriately coated with a sealing member 26. The sealing member 26 required to be a one that can transmit light from the light-emitting element 10. A material of the sealing member 26 is, for example, a thermoplastic resin or a thermosetting resin. The sealing member is preferably formed of at least one type selected from a group consisting of an epoxy resin, a modified epoxy resin, a silicon resin, a modified silicon resin, an acrylate resin, and a urethane resin among the thermosetting resins, and particularly, an epoxy resin, a modified epoxy resin, a silicon resin, and a modified silicon resin are preferred.

The sealing member 26 can be mixed with at least one type selected from a group consisting of a filler, a diffusing agent, a coloring dye, a pigment, a fluorescent material, and a reflective material so as to have a predetermined function. Specifically, as the diffusing agent, barium titanate, titanium oxide, oxidation aluminum, silicon oxide, and the like can be used. An organic or inorganic coloring dye or a coloring pigment can be included for a purpose of cutting an undesired wavelength. Furthermore, the sealing member 26 can include a fluorescent material which absorbs light from the light-emitting element 10 and converts the wavelength, and can be assumed to be a light-emitting device which can emit light in white using a blue light-emitting element and a yellow light-emitting element.

Protection Element

It is possible to further provide a protection element 30 in the light-emitting device 100 as shown in FIGS. 1, 2A and 2B. As a protection element, for example, a zener diode can be preferably used. The protection element 30 is electrically connected to the lead frame 16 by a conductive bonding member in an opening 21 provided at the white resist 20 as shown in FIG. 1 when using a protection element of a type which obtains conductivity from upper and lower surfaces. When using the protection element of a type which has positive and negative electrodes on the upper surface, it is preferable that the protection element be placed on the white resist 20 through a bonding member in the same manner as the light-emitting element 10.

Second Embodiment

Figure 3:
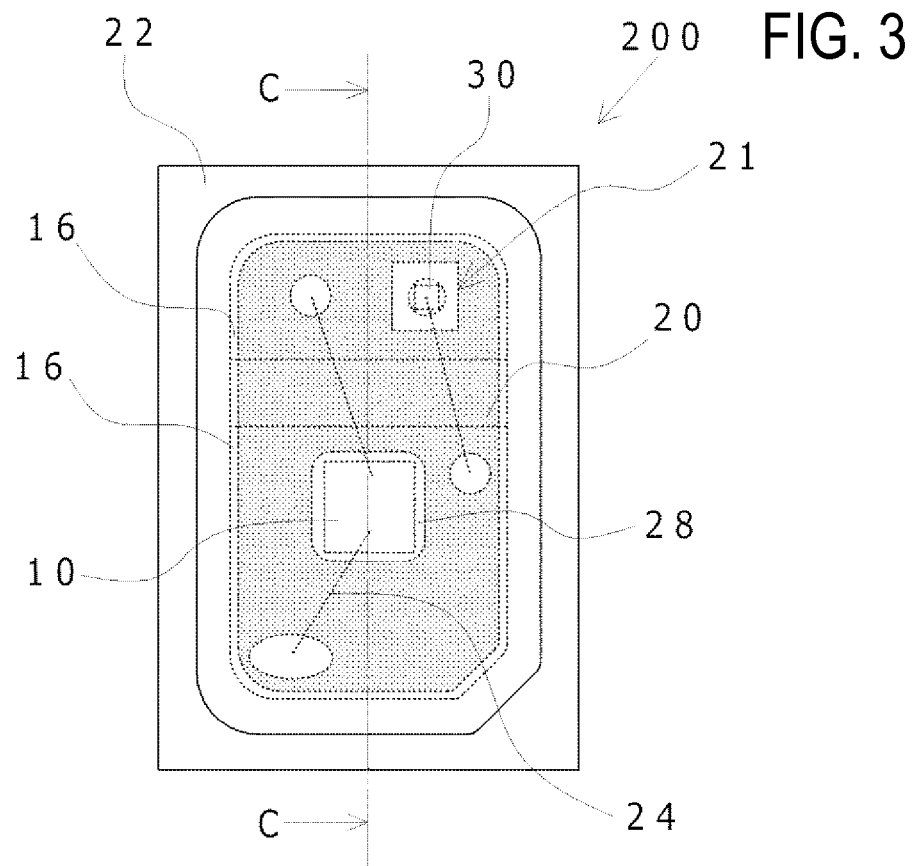
FIG. 3 is a schematic plan view of a light-emitting device according to a second embodiment of the invention.
Figure 4:
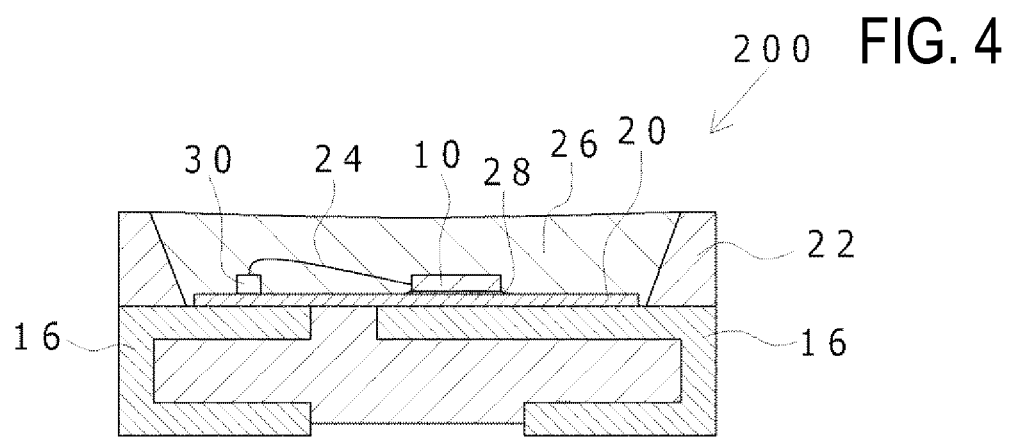
FIG. 4 is a schematic cross-sectional view of the light-emitting device according to the second embodiment of the invention.

Next, a second embodiment will be described. FIG. 3 is a schematic plan view of a light-emitting device 200 according to an embodiment of the invention. FIG. 4 is a schematic cross-sectional view taken along line C-C of the light-emitting device shown in FIG. 3. As shown in FIGS. 3 and 4, the light-emitting device 200 according to the embodiment causes the lead frame 16 of a flat plate shape to outwardly protrude from a side surface of the light-emitting device 200, and bends the protruded portion towards a bottom surface to set the protruded portion as an external electrode. In the embodiment, a pair of lead frames 16 is interposed between molds, and the resin member 22 is molded by injection molding.

Additionally, in the embodiment, in the resin member 22 which insulates a pair of positive and negative lead frames 16, a region exposing to a surface where the light-emitting element 10 is mounted is coated with the white resist 20. That is, in a first embodiment, only an upper surface of the lead frame 16 is coated with the white resist 20; however, a top of the resin member 22 positioned between two spaced lead frames 16 is provided to be coated with the white resist 20 in the embodiment. Accordingly, at the bottom surface of the recess, except for the opening 21 where an electrical connection is made, substantially the entire surface is regarded as the white resist 20. Thus, when using the resin member 22 having a low reflectance, it is possible to obtain high extraction efficiency.

Other respects are substantially the same as a first embodiment, and it is possible to obtain similar effect as the first embodiment in the embodiment.

Third Embodiment

Figure 6:
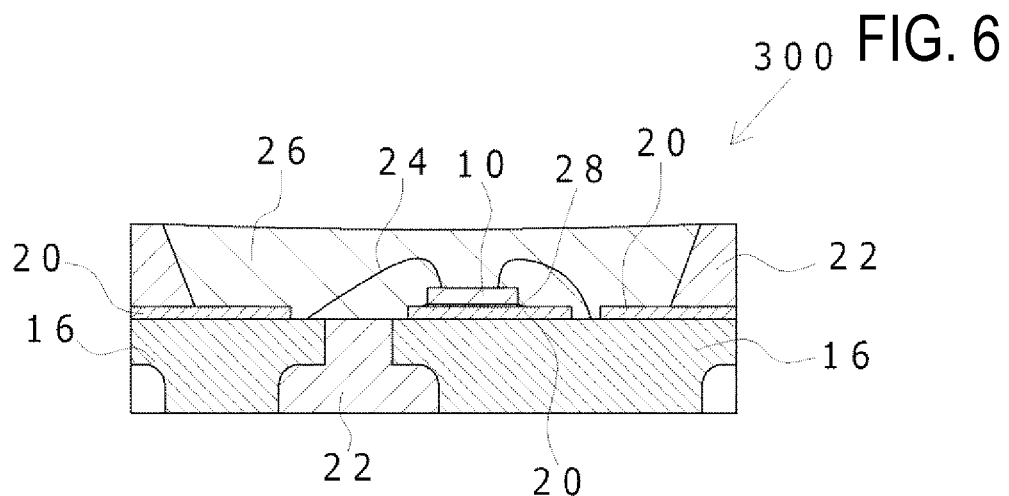
FIG. 6 is a schematic cross-sectional view of a light-emitting device according to a third embodiment of the invention.

Next, a third embodiment will be described. FIG. 6 is a schematic cross-sectional view of a light-emitting device 300 according to an embodiment of the invention. In the embodiment, the white resist 20 is formed on a surface of the lead frame 16 in advance, and then is integrally molded with the resin member 22 by transfer molding. A molding method may be injection molding.

By forming the white resist 20 on a surface of the lead frame 16 in advance as above, it is possible to dispose the white resist 20 between the lead frame 16 and the resin member 22 which forms a reflector at a side surface of a recess. Accordingly, since an exposed area of the lead frame 16 surface is decreased, it is possible to improve the light extraction efficiency.

Other respects in the embodiment are substantially the same as the first embodiment, and it is possible to obtain similar effect as the first embodiment.

Fourth Embodiment

Figure 7:
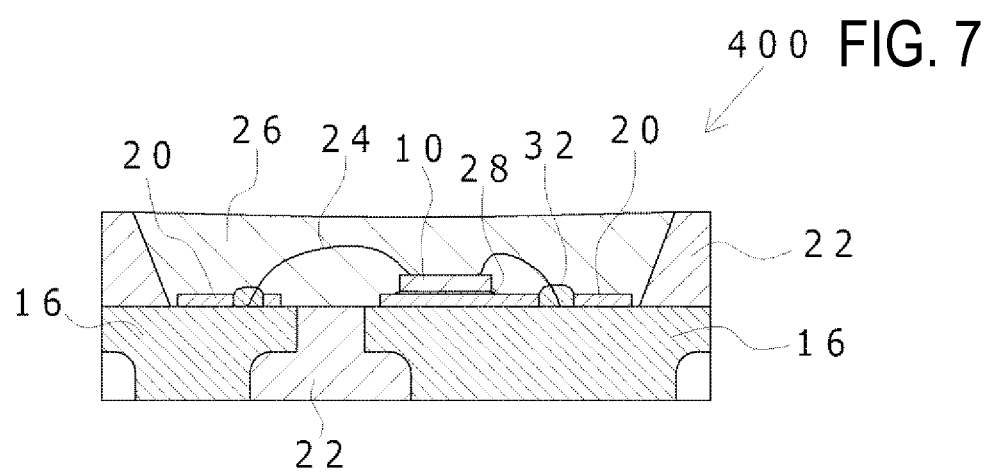
FIG. 7 is a schematic cross-sectional view of a light-emitting device according to a fourth embodiment of the invention.

Next, a fourth embodiment will be described. FIG. 7 is a schematic cross-sectional view of the light-emitting device 400 according to an embodiment of the invention. As shown in FIG. 7, a light reflective resin 32 is disposed so as to cover an opening 21 in the embodiment. The light reflective resin 32 is formed so as to cover a connection portion between the lead frame 16 and the wire 24 after the lead frame 16 and the wire 24 are connected to each other. Accordingly, a portion of the wire 24 is coated with the light reflective resin 32.

As a material of the light reflective resin 32, the same material as a material of the resin member 22 can be used. By disposing the light reflective resin 32 at a portion which does not have the white resist 20 as described above, it is possible to further increase light extraction efficiency.

The light reflective resin may be provided at not only a connection portion between the lead frame 16 and the wire 24, but also a region which is an outer periphery of a recess bottom surface and to which the lead frame 16 is exposed, and may be provided so as to cover the resin member 22 between a pair of lead electrodes.

In the embodiment, Other respects are substantially the same as the first embodiment, and it is possible to obtain similar effect as the first embodiment.

Fifth Embodiment

Figure 8:
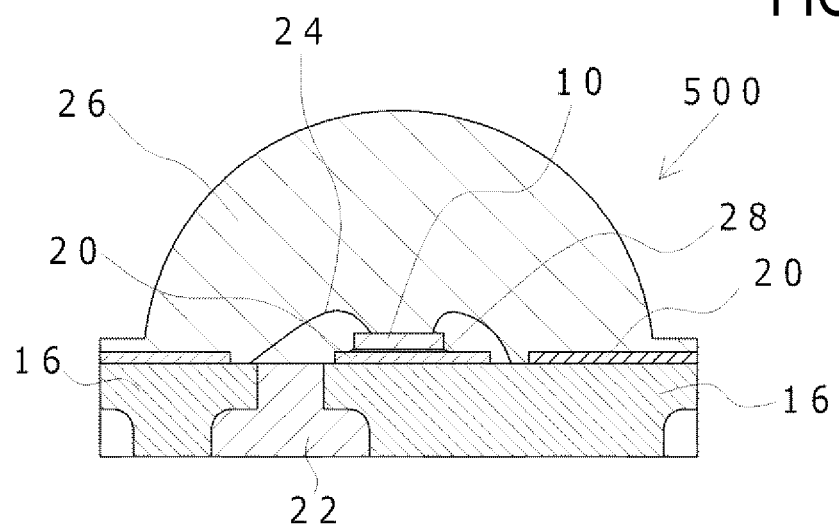
FIG. 8 is a schematic cross-sectional view of a light-emitting device according to a fifth embodiment of the invention.

Next, a fifth embodiment will be described. FIG. 8 is a schematic cross-sectional view of a light-emitting device 500 according to an embodiment of the invention. In the embodiment, the resin member 22 is not in a recess shape, and is molded in a flat plate shape by, for example, transfer molding, so as to expose an upper surface of the lead frame 16. The white resist 20 is disposed on the lead frame 16, and is coated with the sealing member 26 of a lens shape so as to coat the light-emitting element 10. The sealing member 26 of a lens shape can be formed using methods such as transfer formation, compression molding, potting, and the like.

In the embodiment, a wavelength conversion member may be included in the sealing member 26; however, since light emitted from the light-emitting element is diffused when a wavelength conversion member is diffused at a lens-shaped portion, it is preferable to provide the wavelength conversion member only near the light-emitting element 10. For example, the wavelength conversion member is provided near the light-emitting element so as to cover a surface of the light-emitting element 10 using a method such as spray coating, potting, or the like.

In the embodiment, other respects are substantially the same as the first embodiment, and it is possible to obtain the same effect as the first embodiment.

What is claimed is:
1. A light-emitting device comprising:
   a lead frame;
   an insulating white resist provided on the lead frame to be in contact with the lead frame, the insulating white resist having an opening to expose the lead frame;
   a light-emitting element disposed on the insulating white resist and having a transparent substrate;
   a bonding member bonding the transparent substrate and the insulating white resist;
   a wire connecting the light-emitting element and the lead frame at the opening; and
   a sealing member formed on and in direct contact with an edge part of the insulating white resist, the sealing member having transparency,
   wherein the lead frame the insulating white resist, the light-emitting element, and the sealing member are laminated in the order of the lead frame, the insulating white resist, the light-emitting element, and the sealing member.
2. The light-emitting device according to claim 1, wherein the transparent substrate has an insulating property.
3. The light-emitting device according to claim 2, wherein thermal conductivity of the lead frame is 300 W/m·k or more.
4. The light-emitting device according to claim 2, wherein a film thickness of the insulating white resist is 5 µm to 50 µM.
5. The light-emitting device according to claim 2, wherein a light-reflecting resin is disposed in the opening.

6. The light-emitting device according to claim 2, wherein at least a pair of lead frames is provided, a space between the at least a pair of lead frames which is spaced is provided with a resin member, and the insulating white resist is provided so as to cover the resin member between the at least a pair of lead frames.

7. The light-emitting device according to claim 2, wherein the insulating white resist is provided so as to correspond entirely to a bonded surface of the light-emitting element.

8. The light-emitting device according to claim 1, wherein thermal conductivity of the lead frame is 300 W/m·K or more.

9. The light-emitting device according to claim 8, wherein a film thickness of the insulating white resist is 5 μm to 50 μm.

10. The light-emitting device according to claim 8, wherein a light-reflecting resin is disposed in the opening.

11. The light-emitting device according to claim 8, wherein at least a pair of lead frames is provided, a space between the at least a pair of lead frames which is spaced is provided with a resin member, and the insulating white resist is provided so as to cover the resin member between the at least a pair of lead frames.

12. The light-emitting device according to claim wherein a film thickness of the insulating white resist is 5 μm to 50 μm.

13. The light-emitting device according to claim 1, wherein a light-reflecting resin is disposed in the opening.

14. The light-emitting device according to claim 1, wherein at least a pair of lead frames is provided, a space between the at least a pair of lead frames which is spaced is provided with a resin member, and the insulating white resist is provided so as to cover the resin member between the at least a pair of lead frames.

15. The light-emitting device according to claim 1, wherein the insulating white resist is provided so as to correspond entirely to a bonded surface of the light-emitting element.

16. The light-emitting device according to claim 1, wherein a thickness of the lead frame is 0.1 mm to 1.0 mm.

17. The light-emitting device according to claim 1, wherein the sealing member covers the insulating white resist.

18. The light-emitting device according to claim 17, wherein the sealing member covers all of the insulating white resist.

19. The light-emitting device according to claim 17, wherein the sealing member includes a wavelength conversion member.

20. The light-emitting device according to claim 1, wherein the insulating white resist includes at least one of $TiO_2$, $Al_2O_3$, $ZrO_2$, and MgO.

21. The light-emitting device according to claim 1, wherein the lead frame has a recess and a protrusion forming a recessed and protruding shape in a cross-sectional view.

22. The light-emitting device according to claim 1, wherein the sealing member is configured to transmit light, and the insulating white resist is configured to reflect light such that the light is extracted to an upper surface of the light-emitting element.

* * * * *